Figure 1:
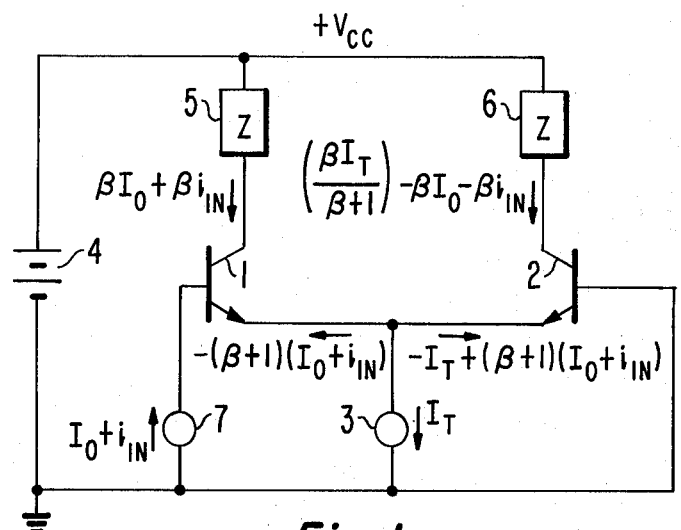

United States Patent [19]

Crowle

[11] 4,004,240
[45] Jan. 18, 1977

[54] PHASE-SPLITTER CIRCUITS

[75] Inventor: Brian Crowle, Ashford, England

[73] Assignee: RCA Corporation, New York, N.Y.

[22] Filed: Feb. 17, 1976

[21] Appl. No.: 658,676

[30] Foreign Application Priority Data

Feb. 24, 1975 United Kingdom ............... 7657/75
Jan. 27, 1976 United Kingdom ............... 3063/76

[52] U.S. Cl. .................................. 330/14; 330/15; 330/17; 330/30 D
[51] Int. Cl.² ......................................... H03F 3/04
[58] Field of Search ................. 330/13, 14, 17, 15, 330/30 D, 69, 117, 146

[56] References Cited
UNITED STATES PATENTS

| | | |
|---|---|---|
| 3,249,897 | 5/1966 | Trilling ............................ 330/14 X |
| 3,304,512 | 2/1967 | McMillan ........................ 330/69 X |
| 3,517,270 | 6/1970 | Dilley ........................... 330/30 D X |
| 3,530,391 | 9/1970 | Goordman ................... 330/30 D X |
| 3,821,656 | 6/1974 | Takeda ............................... 330/15 |

*Primary Examiner*—James B. Mullins
*Attorney, Agent, or Firm*—H. Christoffersen; S. Cohen; A. L. Limberg

[57] ABSTRACT

Phase-splitter circuits making use of the properties of "long-tailed pair" configurations. Each such pair comprises first and second transistors connected to one another at their emitter electrodes and exhibiting an input impedance between their respective base electrodes. In the present circuits, a pair is driven by a signal source having relatively high source impedance between the base electrodes of the transistors.

12 Claims, 7 Drawing Figures

PHASE-SPLITTER CIRCUITS

The present invention relates to phase-splitter circuits.

Figure 4:
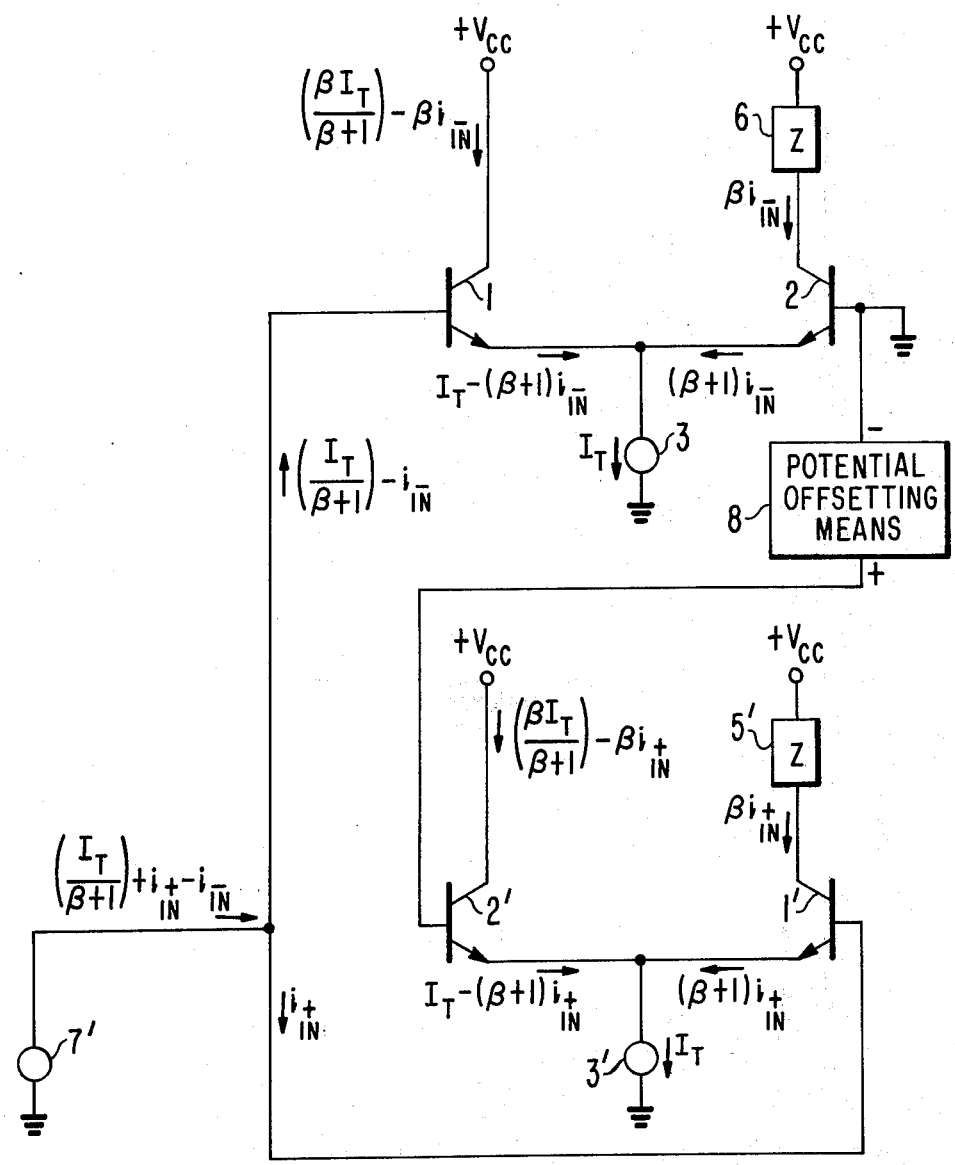
Figure 5:
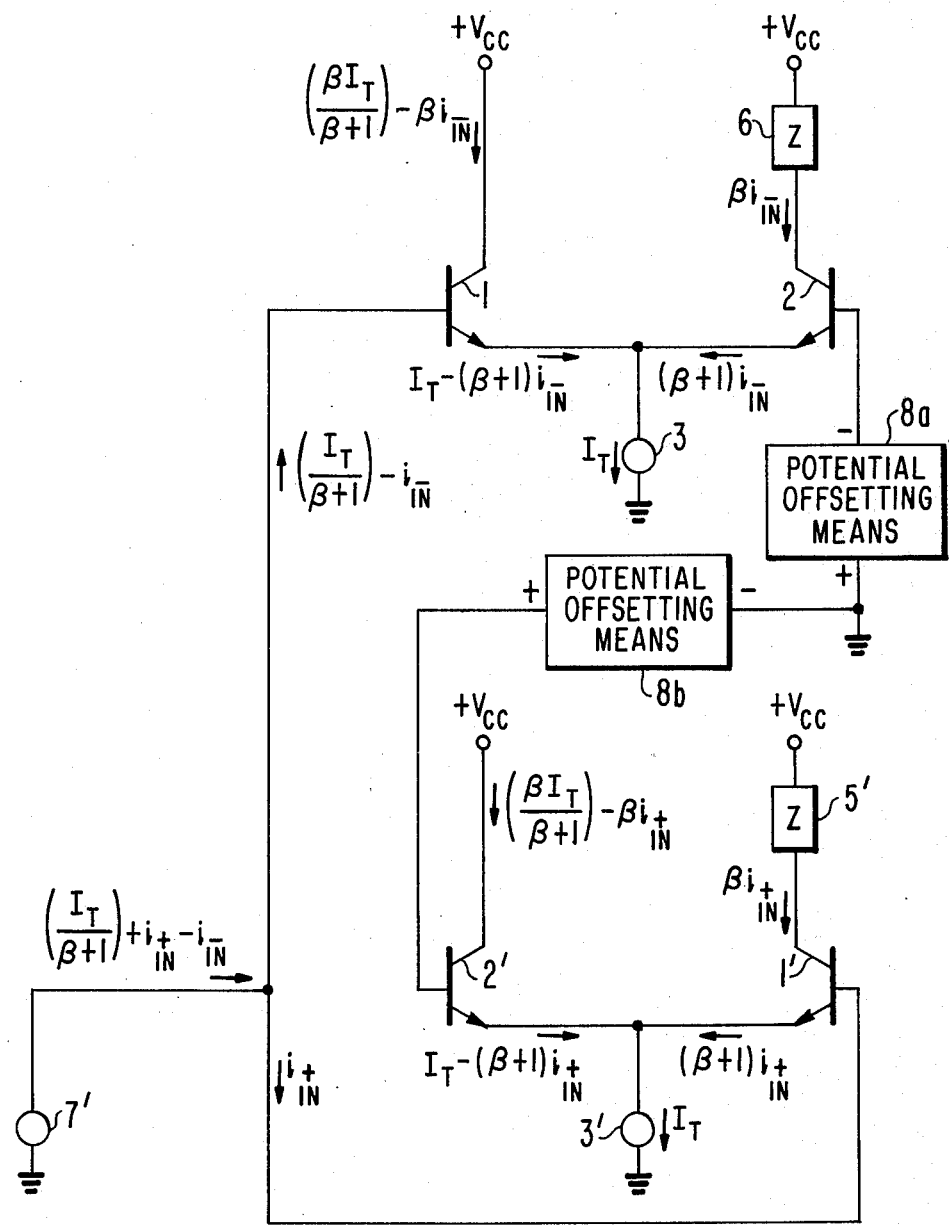
Figure 6:
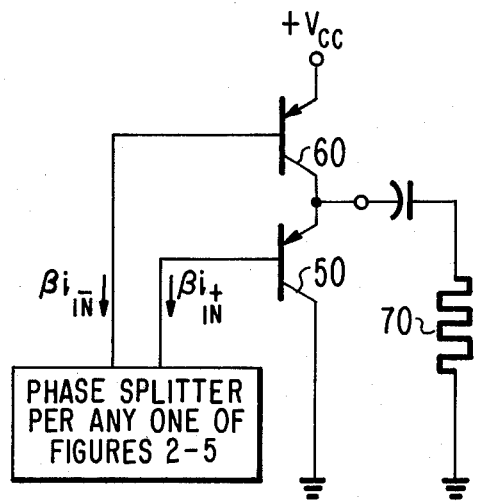
Figure 7:
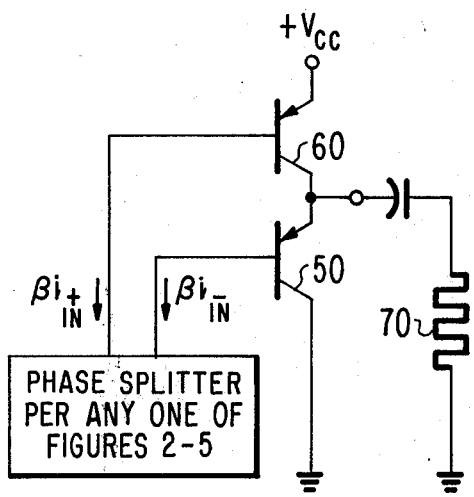

In the drawing:

FIG. 1 is schematic diagram of a long-tailed pair connected in a phase-splitter configuration embodying the invention;

FIGS. 2–5 are schematic diagrams of various phase-splitter configurations embodying the present invention for supplying Class B or AB push-pull output signals responsive to a single-ended input signal; and each of FIGS. 6 and 7 is a schematic diagram, partially in block form, showing the connection of a phase-splitter per any one of the FIGS. 1–5 to supply drive signal currents to push-pull output transistor means in accordance with an aspect of the preset invention.

FIG. 1 shows transistors 1 and 2 connected in long-tailed pair configuration, a constant current generator 3 withdrawing a tail current $I_T$ from the interconnection between their emitter electrodes. $I_T$ is internally determined within generator 3. The base electrode of transistor 2 is connected to a point a reference potential, shown as ground. The collector electrodes of transistors 1 and 2 are connected via impedance elements 5 and 6, respectively, to a source of operating potential shown as battery 4. This source biases the collector-base junctions of the transistors for normal transistor operation. Conventionally, the base electrode of transistor 1 in such a long-tailed pair configuration is driven from a signal voltage source which is referred to the base potential of transistor 2 and has a source impedance substantially lower than the base input impedance of transistor 1. Under such conditions, the apportionment of the demand for current from the emitter electrodes of transistors 1 and 2 depends upon the relative transconductances of transistors 1 and 2, as determined by the difference between their base-emitter voltages, which difference is imposed by the signal voltage source. That is, the common-emitter forward current gains ($\beta$'s) of transistors 1 and 2 do not control the apportionment of $I_T$.

Suppose, on the other hand, the base electrode of transistor 1 is driven with a current having direct and signal components $I_O$ and $i_{IN}$, respectively, the current ($I_O + i_{IN}$) being supplied from a current source 7 which has a source impedance substantially higher than the base input impedance of transistor 1. Perforce, ($I_O + i_{IN}$) must flow as the base current of transistor 1, and the collector and emitter currents of transistor 1 will be $\beta(I_O + i_{IN})$ and $-(\beta+1)(I_O + i_{IN})$ responsive to this base current. The emitter-base potential of transistor 1 will assume whatever value is necessary to do this, the relatively high source impedance of source 6 offering no constraint to any change in the base potential of transistor 1. To satisfy Kirchoff's Current Law, the emitter current of transistor 2 must be $-I_T + (\beta+1)(I_O + i_{IN})$. The collector current of a transistor with a common-emitter forward current gain of $\beta$ is $-\beta/(\beta+1)$ times as large as its emitter current, so the collector current of transistor 2 is $[\beta I_T/(\beta+1)] - I_O - i_{IN}$. The split of current demand between transistors 1 and 2 and the resulting relationships between their collector current variations are functions of their common-emitter forward current gains $\beta$ in the FIG. 1 circuit, rather than the relative transconductance of transistors 1 and 2 as is the case in conventional emitter-coupled differential amplifier arrangements.

Adjusting $I_O$ to affect the relative sizes of the d-c bias components $\beta I_O$ and $[\beta I_T/(\beta+1)] - \beta I_O$ does not alter the ratios of $i_{IN}$ to the collector current variations $\beta i_{IN}$ and $-\beta i_{IN}$, respectively, of transistors 1 and 2--so long as transistors 1 and 2 are not driven into cut-off. This contrasts with the marked decrease in signal gain of the conventionally driven long-tailed pair with increase in the absolute value of the direct component of input signal potential applied between the base electrodes of transistors 1 and 2. Note too that there is essentially no multiplication of the output signal current components by tail current in the FIG. 1 circuit, as contrasted with the conventionally driven long-tailed pair.

The qualities above can make the FIG. 1 circuit of itself an attractive phase-splitter for Class A signals in certain applications, but presents the problem that it is difficult to adjust the direct components of the collector currents of transistors 1 and 2 to be equal. This problem is quite easily overcome by differentially comparing the direct components and applying the difference between the base electrodes of transistors 1 and 2 to complete a feedback loop for degenerating the difference to very small value, relative to signal excursions.

Figure 2:
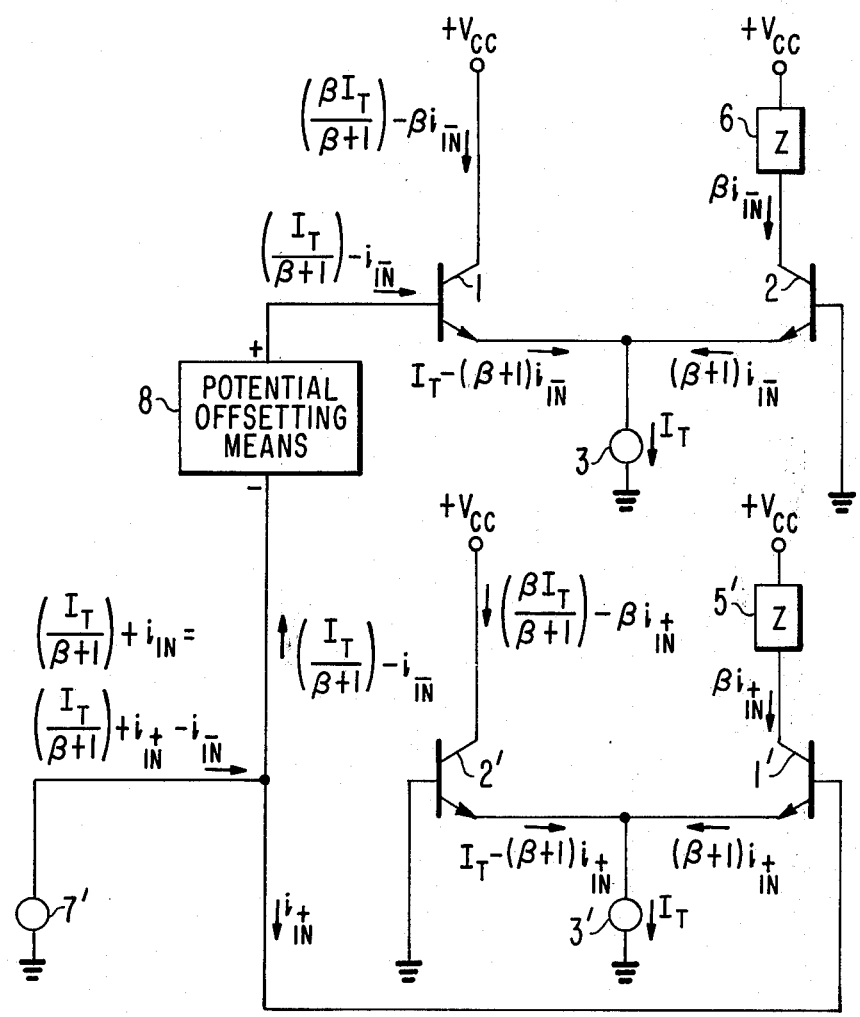

The FIG. 2 phase-splitter arrangement is supplied an input current from constant current generator 7', which input current has a direct component $I_T/(\beta+1)$ and a signal component $i_{IN} = i_{IN}^+ - i_{IN}^-$. By definition, $i_{IN}^+$ and $i_{IN}^-$ are functions comprising the absolute values of, respectively, the positive excursions and the negative excursions of $i_{IN}$. $i_{IN}^+$ is zero-valued during the negative excursions of $i_{IN}$, and $i_{IN}^-$ is zero-valued during positive excursions of $i_{IN}$. The first long-tailed pair 1, 2 is supplemented by a second long-tailed pair 1', 2' supplied combined emitter currents equal to $I_T$ from constant current generator 3'. The base electrodes of transistors 2 and 2' are both grounded. A potential offsetting means 8, floating with respect to ground, is connected between the base electrodes of transistors 1 and 1'. Collector loads are provided transistors 1' and 2 by impedance elements 5' and 6, respectively.

During quiescent conditions, potential offsetting means 8 tends to cause the base-emitter junction of transistor 1 to be forward-biased and that of transistor 1' to be reverse-biased, thereby reducing the base impedance of transistor 1 with respect to the base impedance of transistor 1'. Consequently, a substantially greater portion of the quiescent input current $I_T/(\beta+1)$ flows to the base electrode of transistor 1 than to the base electrode of transistor 1'. For the moment, assume the potential offset provided by means 8 to be sufficiently large that the base electrode of transistor 1 receives substantially the entire quiescent input current $I_T/(\beta+1)$ and the base electrode of transistor 1' receives no appreciable portion of the quiescent input current. Transistor 1' is biased for non-conduction, so its quiescent collector current is zero; and the current $I_T$ demanded by generator 3' from the joined emitter electrodes of transistors 1' and 2' must therefore by supplied from the emitter electrode of transistor 2', causing a quiescent current flow of $\beta I_T/(\beta+1)$ to the collector electrode of transistor 2'. Responsive to its base current $I_T/(\beta+1)$, transistor 1 supplies a current $I_T$ from its emitter electrode, meeting the demand from a current $I_T$ superimposed by generator 3 on the joined emitter electrodes of transistors 1 and 2. Accordingly, transistor 2 is not biased for conduction, and its quiescent collector current is zero. Responsive to its base current $I_T/(\beta+1)$ transistor 1 demands a quiescent collector of $\beta I_T/(\beta+1)$.

Suppose now that $i_{IN}$ exhibits a negative excursion that reduces the input current by an amount $i_{IN}^-$. This reduces the base current available to transistor 1 to a value $[I_T/(\beta+1)] - i_{IN}^-$. In response thereto, a collector current of $[\beta I_T/(\beta+1)] - \beta i_{IN}^-$ flows in transistor 1. Also, the emitter current of transistor 1 is reduced to a value $I_T - (\beta+1) i_{IN}^-$ which is insufficient to meet the $I_T$ current demand generator 3 presents to the joined emitter electrodes of transistors 1 and 2. Perforce, transistor 2 must conduct to supply from its emitter electrode the remainder $(\beta+1) i_{IN}^-$ of the current demanded by generator 3. Responsive to this emitter current, transistor 2 demands a collector current of $\beta i_{IN}^-$. Transistor 1' is still not biased into conduction, and its collector current remains zero-valued. Transistor 2' supplies the entire demand for $I_T$ imposed by current generator 3' and continues to demand, in turn, a collector current of $\beta I_T/(\beta+1)$.

Suppose now that $i_{IN}$ exhibits a positive excursion that increases the input current by an amount $i_{IN}^+$. Base current greater than $I_T/(\beta+1)$ cannot flow in transistor 1, since there is no means for emitter current in excess of $I_T$ to be carried away from the emitter electrode of transistor 1. Generator 3 will only accept a current $I_T$ and any excess emitter current from transistor 1 cannot flow through the emitter electrode of transistor 2 due to the blocking action of its emitter-base junction under reverse-bias conditions. The reverse-biased condition of its emitter-base junction maintains transistor 2 non-conductive, so the collector current of transistor 2 is zero-valued for positive excursions of input current. Perforce, the increment $i_{IN}^+$ of input current from source 7' must flow as base current in transistor 1' causing a collector current $\beta i_{IN}^+$ to flow into transistor 1'. (Also, an emitter current of $(\beta+1) i_{IN}^+$ flows from the emitter electrode of transistor 1', satisfying a portion of the $I_T$ demand of generator 3' and so reducing the emitter current of transistor 2' to a value $I_T-(\beta+1) i_{IN}^+$. The collector current of transistor 2' is then $[\beta I_T/(\beta+1)]-\beta i_{IN}^+$.

The output currents flowing in impedance elements 5' and 6 are therefore in Class B push-pull relationship to each other where the offset potential afforded by means 8 is sufficiently large.

Figure 3:
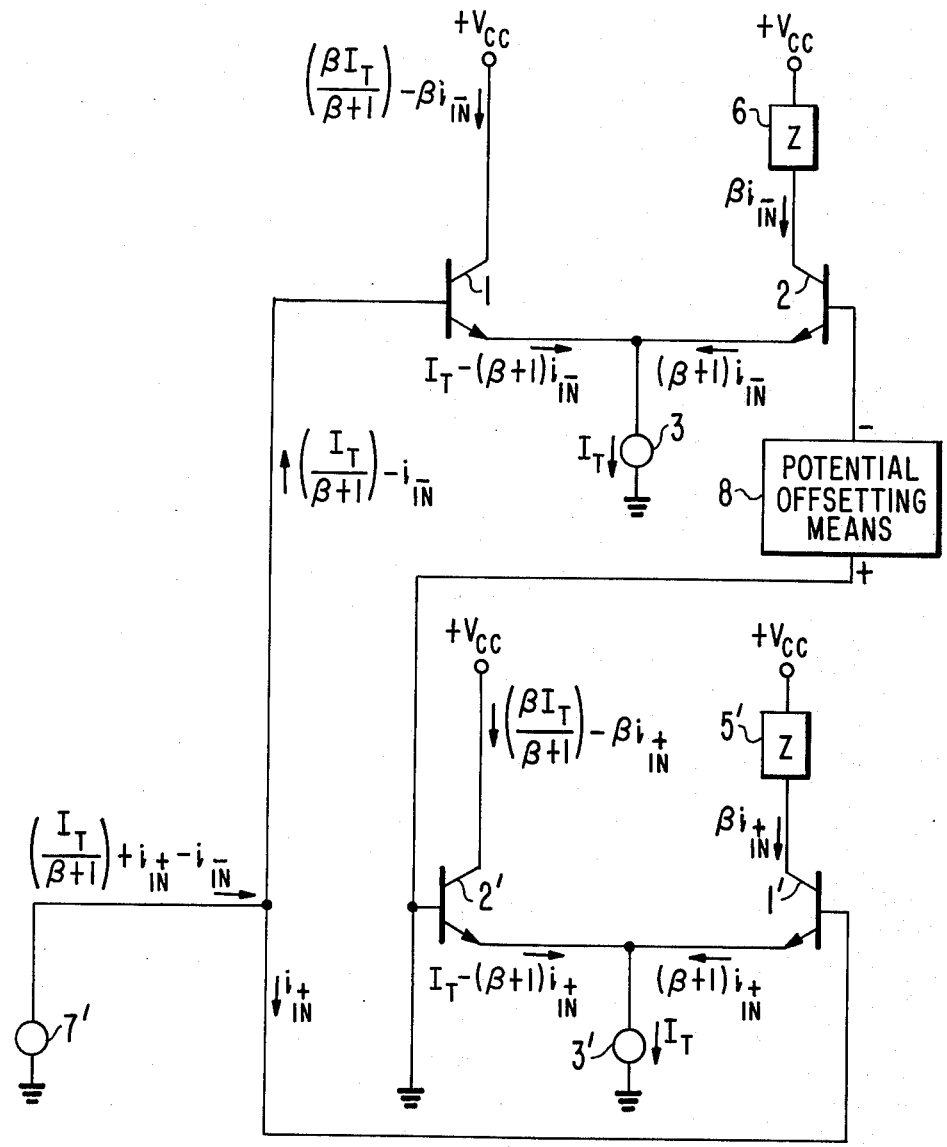

FIGS. 3, 4 and 5 show ways to bias the base electrodes of the long-tailed pairs 1, 2 and 1', 2' vis-a-vis each other, which ways are alternative to that shown in FIG. 2 but achieve similar results. The potential offsetting means does not float with respect to signal ground in these configurations. Rather, means 8 may be grounded at either end, as shown in FIGS. 3 and 4, or may be divided into serially connected potential offsetting means 8a and 8b, grounded at their interconnection, as shown in FIG. 5. The FIG. 2 configuration can be modified to apply current from source 7' to the other terminal of the potential offsetting means 8. Also, potential offsetting means 8 can comprise two portions 8a and 8b similar to FIG. 5, with their interconnection being supplied current from source 7'.

If means 8 be replaced by direct connection, input current divides substantially equally between transistors 1 and 1', and push-pull Class A output currents flow in impedance elements 5' and 6 as taught with regard to the FIG. 1 phase-splitter. This observation suggested to the present inventor that a Class AB push-pull relationship may be obtained between the output currents flowing in the impedance elements 5' and 6 of any of the phase-splitters of FIGS 2–5, if the offset potential provided by means 8 be of intermediate value. Indeed, this has been found to be the case.

The question next arises how to select the appropriate value of offset potential $V_{OFFSET}$ to determine the idling currents to flow in loads 5' and 6. One does this by deciding upon what fraction, $x$, of $I_T$ shall flow as emitter currents $I_{E'1}$ and $I_{E2}$ from transistors 1' and 2, respectively, to support the desired idling current in loads 5' and 6, each of value $I_{E2}\beta/(\beta+1)$. The emitter currents $I_{E1}$ and $I_{E2}$ of transistors 1 and 2', respectively, perforce must then each be $(1-x) I_T$. Each of transistors 1, 2, 1' and 2' obey the following well-known relationship.

$$V_{BE} = (kT/q)\ln (I_E/AJ_S) \tag{1}$$

where
$V_{BE}$ is the base-emitter voltage;
$k$ is Boltzmann's constant;
$T$ is the absolute temperature of the base-emitter junction;
$q$ is the charge on an electron;
$I_E$ is the emitter current;
$A$ is the effective area of the base-emitter junction; and
$J_S$ is the emitter current density for $V_{BE} = 0$. $V_{BE}$, $I_E$ and A will be subscripted with the identification numeral of the transistor with which associated; T and $J_S$ will be assumed alike for the transistors, a valid assumption where the transistors are fabricated in close proximity by identical production steps beginning with the same basic semiconductor material—e.g., are fabricated monolithically.

$$\begin{aligned}V_{OFFSET} &= (V_{BE1} - V_{BE2}) - (V_{BE1'} - V_{BE2'}) \\ &= V_{BE1} + V_{BE2'} - V_{BE2} - V_{BE1'}\end{aligned} \tag{2}$$

Substitutions are made into equation 2 from equation 1 to obtain equation 3, following.

$$\begin{aligned}V_{OFFSET} &= (kT/q)\ln(I_{E1}/A_1J_S) + (kT/q)\ln(I_{E2'}/A_{2'} J_S) \\ &\quad - (kT/q)\ln(I_{E2}/A_2J_S) - (kT/q)\ln(I_{E1'}/A_{1'} J_S) \\ &= (kT/q)\ln(I_{E1} I_{E2'} A_2 A_{1'} / I_{E2} I_{E1'} A_1 A_{2'}) \\ V_{OFFSET} &= (kT/q)\ln[(1-x)I_T(1-x)I_T A_2 A_{1'} / xI_T A_1 A_{2'} )] \\ &= (2kT/q)\ln[(1-x)A_2 A_{1'} / xA_1 A_{2'})]\end{aligned} \tag{3}$$
$$\tag{4}$$

Ways to provide such offset potentials, linearly related to the absolute temperatures of transistor junctions, can be found in U.S. Pat. No. 3,867,685 and from the present inventor's U.S. patent application Ser. No. 646,961 entitled "Current Regulating Circuits" filed on Jan. 7, 1976, and like the present application, assigned to RCA Corporation.

The phase-splitters of FIGS. 2–5 biased by $(kT/q)$ related $V_{OFFSET}$'s are well suited for supplying drive signals to output transistors connected for push-pull Class AB quasi-linear amplification of signals. In such circuits, wherein the collector currents of transistors 1' and 2 supply base drive currents to transistor amplifiers with -related current gains, the constant current generators 3 and 3' can be made to supply currents inversely related to transistor β so as to obtain well-defined idling currents in the collector-to-emitter paths of the output transistors. Arrangements for providing currents inversely related to transistor β are known from U.S. Pat. Nos. 3,855,541, 3,878,471, 3,887,880, 3,891,935 and 3,914,684. Alternatively, the transistor amplifiers supplied by the phase-splitters may be made to have low-level current gains independent of β and generators 3 and 3' made to supply β-independent currents. In these Class AB amplifiers, it is convenient to use an overall direct-coupled feedback connection from amplifier load to the input circuit of the phase-splitter, which connection may include at least one preamplifier stage, to adjust the quiescent input current supplied to the phase-splitter circuit to the $I_T/(\beta+1)$ level.

As noted in connection with the FIG. 1 phase-splitter, modulation of the tail current of a long-tailed pair, the transistors of which are driven by a current generator connected between their respective base electrodes, does not result in analog multiplication of input signal by tail current variation. Rather, the result is addition of the tail current variation and the inverted and amplified input current variation in one of the output currents of the long-tailed pair. Similarly, push-pull modulation of the tail currents demanded by current generators 3 and 3' in any of the phase-splitter arangements of FIGS. 1-5 is found to result in the modulations showing up in push-pull form in the output currents of each long-tailed pair, added to the collector current variations experienced when the tail currents have a constant value $I_T$.

The property above facilitates arrangements for providing current feedback around transistors 1' and 2 separately. It also permits feedback arangements wherein an output signal, formed by push-pull combination of either (a) the collector currents of transistors 1' and 2 or (b) responses to them, controls the push-pull modulation of the tail currents demanded by current generators 3 and 3'. Certain of these latter feedback arrangements are particularly useful in affording load-line limiting protection to output transistors driven in Class B or AB push-pull from one of the phase-splitters of FIGS. 2-5, as taught in my concurrently filed U.S. patent application Ser. No. 658,724 entitled "Over-Current Prevention Circuitry for Transistor Amplifiers", and assigned, like the present application, to RCA Corporation.

FIGS. 6 and 7 show how output transistor means 50 and 60 may be arranged for driving a load 70 in push-pull responsive to input currents from phase-splitters of the sort shown in any one of FIGS. 2-5. Each of the transistor means 50 and 60 may be a simple trnsistor or alternatively may be a compound transistor structure of the several known types.

Phase-splitter circuits similar to those shown in FIGS. 1-5 in which the transistors are replaced by current mirror amplifiers to achieve current gains substantially invariant despite temperature and manufacturing variations, are possible and are to be considered to fall within the scope of the following claims.

What is claimed is:

1. A phase-splitter circuit comprising:
  first and second input terminals, said second input terminal being at a point of reference potential;
  means for applying a single-ended input signal current between said first and said second input terminals;
  first, second, third and fourth transistors of the same conductivity type, each having base and emitter and collector electrodes and being operated at an absolute temperature substantially equal to T;
  means connecting the base electrode of said first transistor to said first input terminal;
  means connecting the base electrode of said second transistor to said second input terminal;
  means connecting the vase electrode of said third transistor to said first input terminal;
  means connecting the base electrode of said fourth transistor to said second input terminal;
  first current generator means being connected at one of its terminals to said second input terminal and at another of its terminals to the emitter electrodes of said first and said second transistors for generating a first regulated current flow between its two terminals;
  second current generator means being connected at one of its terminals to said second input terminal and at another of its terminals to the emitter electrodes of said third and said fourth transistors for generating a second regulated current flow between its two terminals;
  means for applying first and second quiescent bias potentials, said first bias potential being applied between the base electrodes of said first and said second transistors in a poling tending to make said first transistor substantially less conductive of said first regulated current flow than said second transistor for a condition where said single ended input signal is zero-valued, and said second quiescent bias potential being applied between the base electrodes of said third and said fourth transistors in a poling tending to make said fourth transistor substantially less conductive of said second regulated current flow than said third transistor for said condition where said single-ended input signal is zero-valued;
  a first output terminal to which the collector electrode of said first transistor is connected;
  first load means having a direct current path therethrough connecting said first output terminal to a terminal for an operating voltage;
  a second output terminal to which the collector electrode of said fourth transistor is connected; and
  second load means having a direct path therethrough connecting said second output terminal to a terminal for an operating voltage.

2. A phase-splitter circuit as set forth in claim 1 wherein said means for applying first and second quiescent bias potentials comprises:
  a substantially direct connection between the base electrodes of said second and said fourth transistors; and
  means for applying a potential proportional to T between the base electrodes of said first and said third transistors.

3. A phase-splitter circuit as set forth in claim 2 having in combination therewith a push-pull amplifier stage comprising:
  first and second transistor means of a complementary conductivity type to said transistors, each of said transistor means having input and output and common electrodes, their input electrodes having respective separate ones of said first and said second phase-splitter circuit output terminals connected to them;

means for applying an operating potential between the output electrode of said first transistor means and the common electrode of said second transistor means; and an output terminal for said push-pull amplifier stage to which the common terminal of said first transistor means and the output terminal of said second transistor means are each connected.

4. A phase-splitter circuit as set forth in claim 1 wherein said means for applying first and second quiescent bias potentials comprises:

a substantially direct connection between the base electrodes of said first and said third transistors; and means for applying a potential proportional to T between the base electrodes of said second and said fourth transistors.

5. A phase-splitter circuit as set forth in claim 4 having in combination therewith a push-pull amplifier stage comprising:

first and second transistor means of a complementary conductivity type to said transistors, each of said transistor means having input and output and common electrodes, their input electrodes having respective separate ones of said first and said second phase-splitter circuit output terminals connected to them;

means for applying an operating potential between the output electrode of said first transistor means and the common electrode of said second transistor means; and an output terminal for said push-pull amplifier stage to which the common terminal of said first transistor means and the ouput terminal of said second transistor means are each connected.

6. A phase-splitter circuit as set forth in claim 1 having in combination therewith a push-pull amplifier stage comprising:

first and second transistor means of a complementary conductivity type to said transistors, each of said transistor means having input, output and common electrodes, their input electrodes having respective separate ones of said first and said second phase-splitter circuit output terminals connected to them;

means for applying an operating potential between the output electrode of said first transistor means and the common electrode of said second transistor means; and an output terminal for said push-pull amplifier stage to which the common terminal of said first transistor means and the output terminal of said second transistor means are each connected.

7. In combination:

first and second transistors of the same conductivity type, each having base and emitter and collector electrodes and exhibiting when conductive a current gain substantially equal to $\beta$ between its base and collector electrodes, their respective emitter electrodes being joined at an interconnection;

first output signal current utilization means having a current conductive path therethrough;

a first terminal to which the base electrode of said second transistor is connected, and a second terminal to which the collector electrode of said first transistor is connected and to which the collector electrode of said second transistor is connected via the current conductive path through said first output signal current utilization means, said first and second terminals for receiving a potential therebetween of proper amplitude and polarity for implementing normal operating conditions for said first and said second transistors;

first current generator means for causing a predetermined current flow $I_T$ between said first terminal and said interconnection at which the emitter electrodes of said first and second transistors are joined;

second current generator means for impressing from a relatively high source impedance an input current between the base electrodes of said first and said second transistors, said input current comprising a first component substantially equal to $I_T/(\beta+1)$ and a second component, said second component being a signal component having excursions of both first and second opposite polarities; and means for accepting excursions of said second component of input signal which are of said second polarity, whereby responsive to excursions of the second component of said input signal in a first polarity, a first output signal current $\beta$ times as large flows in the current conductive path through said first ouput signal current utilization means.

8. The combination set forth in claim 7 wherein said means for accepting excursions of said second component of input signal which are of said second polarity comprises:

third and fourth transistors of said same conductivity type, each having base and emitter and collector electrodes and exhibiting when conductive a current gain substantially equal to $\beta$ between its base and collector electrodes, the base and collector electrodes of said fourth transistor being connected respectively to said first terminal and to said second terminal;

second output signal current utilization means having a current conductive path therethrough, which path connects the collector electrode of said third transistor to said second terminal;

third current generator means for causing a predetermined current flow between said first terminal and an interconnection of the emitter electrodes of said third and said fourth transistors; and potential offsetting means connected between the respective base electrodes of said first and said third transistors in a poling for making said second and said third transistors less conductive than said first and said fourth transistors whenever said second component of input signal is zero-valued, whereby responsive to excursions in a second polarity of said second component of said input signal a second output signal current $\beta$ times as large flows in the current utilization means, said second output signal current being in push-pull relationship with said first output signal current.

9. The combination set forth in claim 8 wherein said potential offsetting means applies an offset potential between the respective base electrodes of said first and said third transistors of an amplitude proportional to the absolute temperature at which the first, second, third and fourth transistors are operated.

10. The combination set forth in claim 7 wherein said means for accepting excursions of said second component of input signal which are of said second polarity comprises:

third and fourth transistors of the same conductivity type each having base and emitter and collector electrodes and exhibiting when conductive a current gain substantially equal to $\beta$ between its base and collector electrodes, the base electrode of said third transistor being connected to the base electrode of said first transistor, and the collector electrode of said fourth transistor being connected to said second terminal;

second output signal current utilization means having a current conductive therethrough, which path connects the collector electrode of said third transistor to said second terminal;

third current generator means for causing a predetermined current flow between said first terminal and an interconnection of the emitter electrodes of said third and said fourth transistors; and potential offsetting means connected between the respective base electrodes of said second and said fourth transistors, in a poling for making said second and said third transistors less conductive than said first and said fourth transistors whenever said second component of input signal is zero-valued, whereby responsive to escursions in a second polarity of said second component of said input signal a second output signal current $\beta$ times as large flows in the current conductive path through said second output signal current utilization means, said second output signal current being in push-pull relationship with said first output signal current.

11. The combination set forth in claim 10 wherein said potential offsetting means applies an offset potential between the respective base electrodes of said second and said fourth transistors of an amplitude linearly proportional to the absolute temperature at which the first, second, third and fourth transistors are operated.

12. In combination:

first and second terminals for receiving an operating potential therebetween;

first and second transistors of the same conductivity type, each having base and emitter and collector electrodes and exhibiting a gain substantially equal to $\beta$ between its base and collector electrodes, the base elctrode of said second transistor being connected to said first terminal;

output signal current utilization means having a current conductive path therethrough;

first current generator means for causing a predetermined current flow $I_T$ between said first terminal and an interconnection of the emitter electrodes of said first and said second transistors, which current flow is independent of the potential appearing between said first terminal and said interconnection of the emitter electrodes of said first and said second transistors;

connections of said second terminal to the collector electrodes of said first and said second transistors, one of which connections is through the current conductive path through said output signal utilization means; and second current generator means for impressing from a relatively high source impedance an input current comprising at least a signal current component between the base electrodes of said first and said second transistors, whereby responsive to said signal current component of said input signal an output signal current $\beta$ times as large flows in the current conductive path through said output signal utilization means.

* * * * *

UNITED STATES PATENT OFFICE
CERTIFICATE OF CORRECTION

PATENT NO. : 4,004,240

DATED : January 18, 1977

INVENTOR(S) : Brian Crowle

It is certified that error appears in the above-identified patent and that said Letters Patent are hereby corrected as shown below:

In the abstract, last line, before "between" insert -- connected --.
Column 1, line 16, "1-5" should read -- 2-5 --.
Column 1, line 24, after "point" insert -- at --.
Column 1, line 59, "($\beta$+1)" should read -- ($\beta$+1) --.
Column 1, line 63, "[$\beta I_T(\beta+1)$]" should read -- [$\beta I_T/(\beta+1)$] --.
Column 2, line 61, "by" should read -- be --.
Column 3, line 4, "$\beta I_T(\beta+1)$" should read -- $\beta I_T/(\beta+1)$ --.
Column 3, line 22, "$\beta I_T(\beta+1)$" should read -- $\beta I_T/(\beta+1)$ --.
Column 4, line 40 et seq., equation 2 should read:

$$-- V_{OFFSET} = (V_{BE1} - V_{BE2}) - (V_{BE1'} - V_{BE2'})$$
$$= V_{BE1} + V_{BE2'} - V_{BE2} - V_{BE1'} -- \qquad (2)$$

Column 4, lines 47 et seq., equations 3 and 4 should read:

$$-- V_{OFFSET} = (kT/q)\ln(I_{E1}/A_1 J_S) + (kT/q)\ln(I_{E2'}/A_{2'} J_S)$$
$$- (kT/q)\ln(I_{E2}/A_2 J_S) - (kT/q)\ln(I_{E1'}/A_{1'} J_S)$$
$$= (kT/q)\ln(I_{E1} I_{E2'} A_2 A_{1'}/I_{E2} I_{E1'} A_1 A_{2'}) -- (3)$$

$$-- V_{OFFSET} = (kT/q)\ln[(1-x)I_T(1-x)I_T A_2 A_{1'}/xI_T x I_T A_1 A_{2'})]$$
$$= (2kT/q)\ln[(1-x)A_2 A_{1'}/x A_1 A_{2'})] -- \qquad (4)$$

Column 4, line 67, insert -- $\beta$ -- before "-related".
Column 5, line 28, "1-5" should read -- 2-5 --.
Column 5, line 53, "trnsistor" should read -- transistor --.

UNITED STATES PATENT OFFICE
CERTIFICATE OF CORRECTION

PATENT NO. : 4,004,240

DATED : January 18, 1977

INVENTOR(S) : Brian Crowle

It is certified that error appears in the above-identified patent and that said Letters Patent are hereby corrected as shown below:

Column 6, line 9, "vase" should read -- base --.
Column 8, line 54, after "current" insert -- conductive path through said second output signal current --.
Column 9, line 9, after "conductive" insert -- path --.
Column 10, line 8, "elctrode" should read -- electrode --.

Signed and Sealed this

Third Day of May 1977

[SEAL]

Attest:

RUTH C. MASON
*Attesting Officer*

C. MARSHALL DANN
*Commissioner of Patents and Trademarks*